United States Patent
Tsuji et al.

(10) Patent No.: US 9,407,312 B2
(45) Date of Patent: Aug. 2, 2016

(54) AMPLIFIER CIRCUIT, ANTENNA MODULE AND WIRELESS COMMUNICATION APPARATUS

(71) Applicants: Masaaki Tsuji, Osaka (JP); Kohji Kawahata, Osaka (JP); Nobunari Tsukamoto, Osaka (JP); Naohiro Itoh, Hyogo (JP)

(72) Inventors: Masaaki Tsuji, Osaka (JP); Kohji Kawahata, Osaka (JP); Nobunari Tsukamoto, Osaka (JP); Naohiro Itoh, Hyogo (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/428,238

(22) PCT Filed: Sep. 11, 2013

(86) PCT No.: PCT/JP2013/075209
§ 371 (c)(1),
(2) Date: Mar. 13, 2015

(87) PCT Pub. No.: WO2014/042277
PCT Pub. Date: Mar. 20, 2014

(65) Prior Publication Data
US 2015/0229346 A1 Aug. 13, 2015

(30) Foreign Application Priority Data

Sep. 13, 2012 (JP) .................. 2012-201399
Jan. 22, 2013 (JP) .................. 2013-009536

(51) Int. Cl.
*H04B 15/00* (2006.01)
*H04B 1/40* (2015.01)
(Continued)

(52) U.S. Cl.
CPC .............. *H04B 1/40* (2013.01); *G06K 19/0723* (2013.01); *G06K 19/0726* (2013.01); *H03D 1/00* (2013.01);
(Continued)

(58) Field of Classification Search
CPC ........ H04B 5/0056; H04B 1/40; H04B 15/00; H04B 5/0031; H04B 1/3827; H04B 2001/0408; G06K 19/0723; G06K 19/0726
See application file for complete search history.

(56) References Cited

U.S. PATENT DOCUMENTS 6,321,067 B1 * 11/2001 Suga .................... G06K 7/0008
455/106
2005/0176381 A1 8/2005 Ieki et al.
(Continued)

FOREIGN PATENT DOCUMENTS

JP   H10-145987   5/1998
JP   2003-318774  11/2003
(Continued)

OTHER PUBLICATIONS

European search report dated Jul. 29, 2015 in corresponding.
(Continued)

*Primary Examiner* — Ping Hsieh
(74) *Attorney, Agent, or Firm* — Cooper & Dunham LLP

(57) ABSTRACT

An amplifier circuit that amplifies a carrier wave that a transmitting and receiving part has received, and includes a superimposition wave generation part that generates a superimposition wave to be superimposed onto the carrier wave; an amplifying part that adds the carrier wave and the superimposition wave to obtain an amplified carrier wave and outputs the amplified carrier wave; and an amplitude detection part that detects, based on a change in an amplitude value of the carrier wave, that the carrier wave is a predetermined carrier wave that carries a predetermined communication signal. The amplifier circuit outputs the amplified carrier wave when having detected the predetermined carrier wave.

11 Claims, 8 Drawing Sheets

(51) Int. Cl.
*G06K 19/07* (2006.01)
*H03D 1/00* (2006.01)
*H04B 5/00* (2006.01)
*H03F 3/19* (2006.01)
*H04B 1/3827* (2015.01)
*H04B 1/04* (2006.01)

(52) U.S. Cl.
CPC ............... *H03F 3/19* (2013.01); *H04B 1/3827* (2013.01); *H04B 5/0031* (2013.01); *H04B 5/0056* (2013.01); *H04B 15/00* (2013.01); *H03F 2200/451* (2013.01); *H04B 2001/0408* (2013.01)

(56) References Cited

U.S. PATENT DOCUMENTS

| | | | |
|---|---|---|---|
| 2007/0026840 A1* | 2/2007 | Oga | H04B 1/0003 455/348 |
| 2008/0079542 A1* | 4/2008 | Rofougaran | G06K 19/0723 340/10.1 |
| 2009/0040022 A1 | 2/2009 | Finkenzeller | |
| 2009/0174592 A1* | 7/2009 | Muellner | H04B 1/00 342/51 |
| 2011/0051780 A1* | 3/2011 | Kawasaki | H04B 1/40 375/135 |
| 2014/0300522 A1 | 10/2014 | Kato et al. | |

FOREIGN PATENT DOCUMENTS

| | | |
|---|---|---|
| JP | 2007-065977 | 3/2007 |
| JP | 2007-081646 | 3/2007 |
| JP | 2009-065426 | 3/2009 |
| JP | 2013-098927 | 5/2013 |

OTHER PUBLICATIONS

European Patent Application No. 13836839.4.
International Search Report Issued on Dec. 3, 2013 in PCT/JP2013/075209 filed on Sep. 11, 2013.

* cited by examiner

US 9,407,312 B2

AMPLIFIER CIRCUIT, ANTENNA MODULE AND WIRELESS COMMUNICATION APPARATUS

TECHNICAL FIELD

The present invention relates to an amplifier circuit that amplifies a carrier wave that a transmitting and receiving part has received, an antenna module including the amplifier circuit and a wireless communication apparatus including the antenna module.

BACKGROUND ART

Recently, portable devices that are driven by secondary batteries and carry out short distance wireless communication using, for example, Radio Frequency IDentification (RFID), are in widespread use (see Japanese Laid-Open Patent Application No. 2009-65426). Concerning such a portable device, it is demanded to miniaturize an antenna provided inside. However, if the antenna is miniaturized, the communication performance may be degraded due to gain deterioration. Therefore, in a recent portable device, ingenuity is exercised to contain the antenna inside in a manner of conserving space while maintaining the communication performance.

For example, techniques of forming an antenna that has a film-like shape to be affixed to a battery pack including a secondary battery, forming an antenna to be long and thin to be placed at a side corner or a lower corner of a portable device, and so forth, are known.

However, in these techniques, the antennas may have shapes derived from free spaces left inside the portable devices. Therefore, the shapes and/or the places of the antennas may depend on the shapes and/or the sizes of the portable devices.

Therefore, it may be necessary to consider the shapes and/or the places of the antennas for the respective portable devices, one by one. Further, depending on the places of the antennas, the impedances between the antennas and subsequent circuits may be changed. Therefore, it may be necessary to adjust the impedances and so forth for the respective portable devices, one by one. Thus, the processes required for mounting the antennas may be complicated and/or troublesome.

SUMMARY OF INVENTION

According to one embodiment of the present invention, an amplifier circuit amplifies a carrier wave that a transmitting and receiving part has received, and includes a superimposition wave generation part that generates a superimposition wave to be superimposed onto the carrier wave; an amplifying part that adds the carrier wave and the superimposition wave to obtain an amplified carrier wave and outputs the amplified carrier wave; and an amplitude detection part that detects, based on a change in an amplitude value of the carrier wave, that the carrier wave is a predetermined carrier wave that carries a predetermined communication signal. The amplifier circuit outputs the amplified carrier wave when having detected the predetermined carrier wave.

Other objects, features and advantages of the present invention will become more apparent from the following detailed description when read in conjunction with the accompanying drawings.

DESCRIPTION OF THE EMBODIMENTS

According to an embodiment of the present invention, it is possible to miniaturize an antenna while maintaining communication performance, by superimposing a superimposition wave having a predetermined frequency on a carrier wave received via the antenna, and outputting the superimposed carrier wave to a wireless communication part.

First Embodiment

Figure 1:
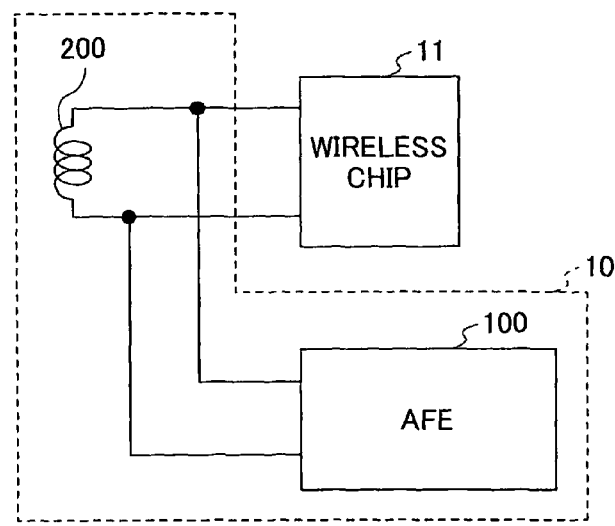
FIG. 1 illustrates an antenna module according to a first embodiment.

Below, a first embodiment will be described. FIG. 1 illustrates an antenna module according to the first embodiment.

The antenna module 10 according to the first embodiment includes an amplifier circuit 100 and an antenna 200, and is connected with a wireless chip 11.

The antenna module 10 according to the first embodiment amplifies a carrier wave when the carrier wave received via the antenna 200 carries a communication signal that is expressed by a change in the amplitude value of the carrier wave, thus increasing the amplitude change, and supplying the carrier wave to the wireless chip 11. In this configuration, the antenna module 10 according to the first embodiment can maintain the communication performance even in a case where the antenna 200 is miniaturized.

Figure 2:
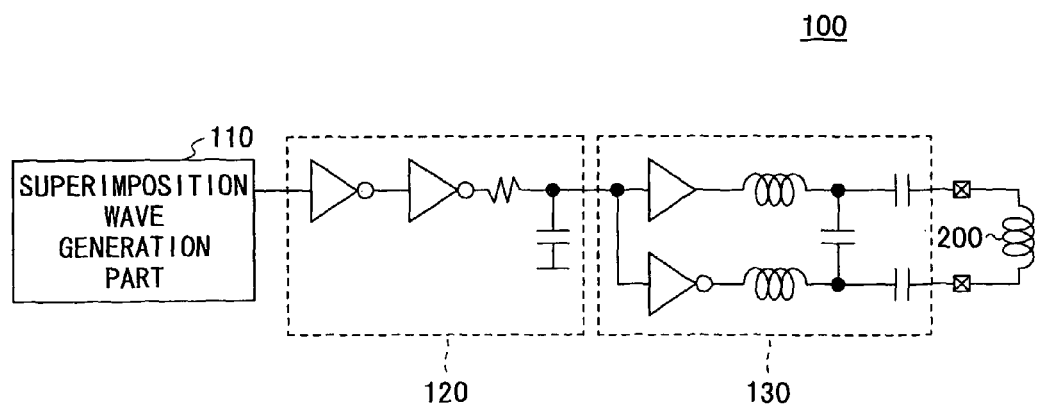
FIG. 2 illustrates amplification of a carrier wave according to the first embodiment.

Below, using FIG. 2, amplification of the carrier wave according to the first embodiment will be described. FIG. 2 illustrates amplification of the carrier wave according to the first embodiment.

According to the first embodiment, a superimposition wave generation part 110 generates a signal (superimposition wave) having a predetermined frequency, and the harmonic component(s) of the signal generated by the superimposition wave generation part 110 is(are) removed by a harmonic removal part 120. Then, the signal from which the harmonic component(s) has(have) been thus removed is added, via a driver 130, to the carrier wave that the antenna 200 has received. Thus, according to the first embodiment, it is possible to increase the amplitude of the carrier wave, and thus, it is possible to maintain the communication performance even when the antenna 200 is miniaturized and the gain is otherwise deteriorated.

Figure 3:
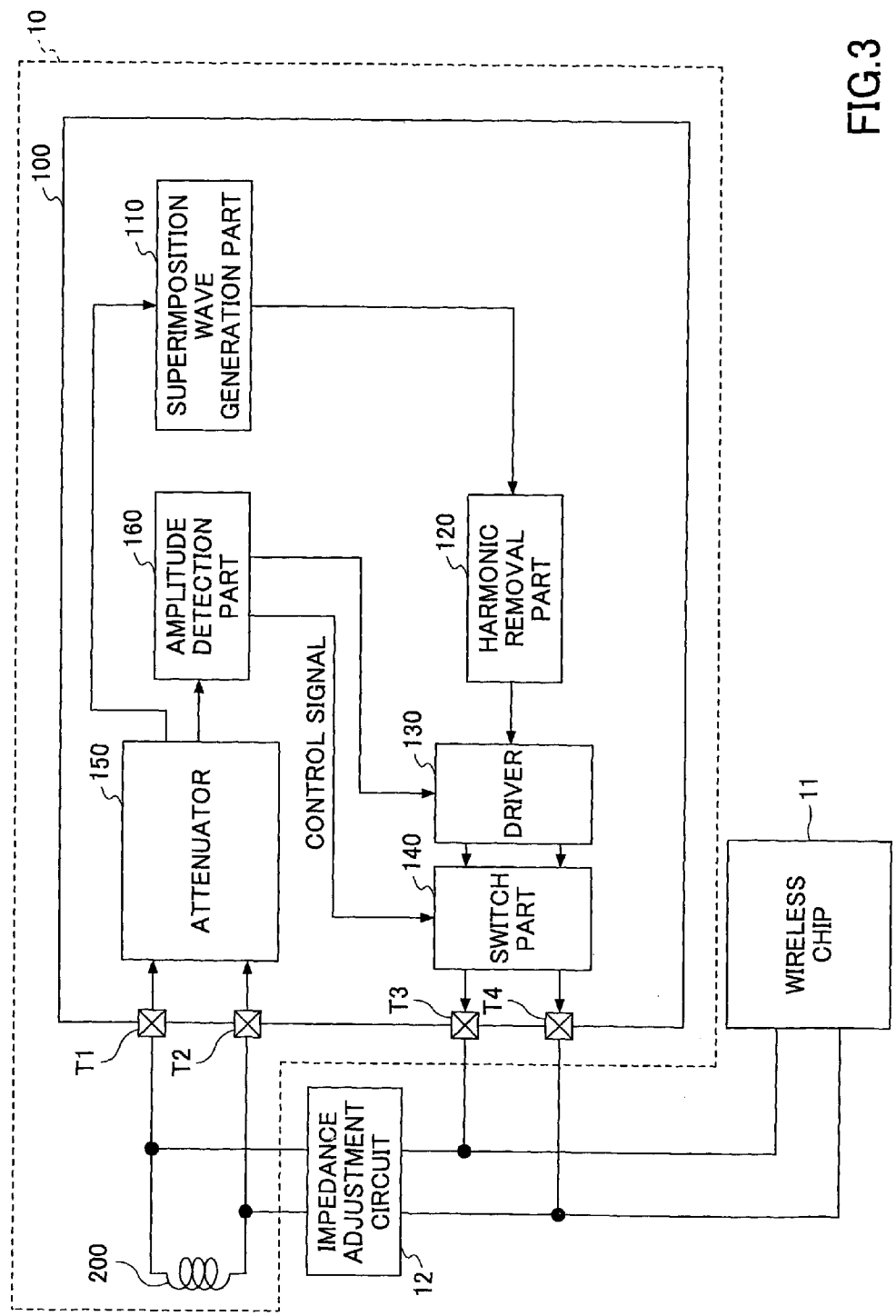
FIG. 3 illustrates an amplifier circuit according to the first embodiment.

FIG. 3 illustrates the amplifier circuit 100 according to the first embodiment. The amplifier circuit 100 according to the first embodiment includes the superimposition wave generation part 110, the harmonic removal part 120, the driver 130, a switch part 140, an attenuator 150, and an amplitude detection part 160. Further, the amplifier circuit 100 includes terminals T1, T2, T3 and T4. In the amplifier circuit 100 according to the first embodiment, the terminals T1 and T2 are input terminals, and the terminals T3 and T4 are output terminals.

In the amplifier circuit 100 according to the first embodiment, the terminals T1 and T2 are connected with the antenna 200, and the terminals T3 and T4 are connected with the wireless chip 11. Further, the antenna 200 is connected with the wireless chip 11 via the impedance adjustment circuit 12. The impedance adjustment circuit 12 adjusts the impedance between the antenna 200 and the wireless chip 11.

The amplifier circuit 100 according to the first embodiment detects, based on the amplitude value of a carrier wave that is input from the terminals T1 and T2, a carrier wave that carries a predetermined communication signal. Then, the amplifier circuit 100 superimposes the signal having the predetermined frequency (referred to as a superimposition signal, hereinafter) on the detected carrier wave. Then, the thus amplified signal is output to the wireless chip 11 via the impedance adjustment circuit 12.

Below, the wireless chip 11 according to the first embodiment will be further described. The wireless chip 11 according to the first embodiment is, for example, a RFID chip or the like, and may have a memory in which identification information for identifying a portable phone in which the wireless chip 11 is mounted or the like is stored. The wireless chip 11 may be one that is other than a RFID chip, and, for example, may be a RFID controller that can also be used as a RFID reader/writer.

For example, when the wireless chip 11 has approached a RFID reader or the like, the wireless chip 11 receives a carrier wave having a predetermined frequency (for example, 13.56 MHz) transmitted from the RFID reader via the antenna module 10.

The amplifier circuit 100 in the antenna module 10 according to the first embodiment amplifies a carrier wave when the carrier wave received by the antenna 200 carries a communication signal expressed by a change in the amplitude value of the carrier wave, and supplies the amplified carrier signal to the wireless chip 11. Hereinafter, such a carrier wave that carries such a communication signal will be referred to as a "modulated carrier wave".

When a modulate carrier wave has been supplied to the wireless chip 11, the wireless chip 11 returns a response signal via the antenna module 10 through load modulation of switching a load (not shown) inside the wireless chip. It is noted that a period of time during which the wireless chip 11 returns the response signal is a period of time during which the antenna 200 receives a carrier wave, the amplitude value of which does not change.

It is to be noted that, in the description of the first embodiment, a description has been made for the antenna module 10 amplifying a modulated carrier wave to be supplied to the wireless chip 11. However, an embodiment is not limited thereto. The antenna module 10 may amplify the response signal in which the amplitude value of the carrier wave has been changed through load modulation by the wireless chip 11, and supply the amplified response signal to the antenna 200. This configuration will be described later for another embodiment.

Figure 4:
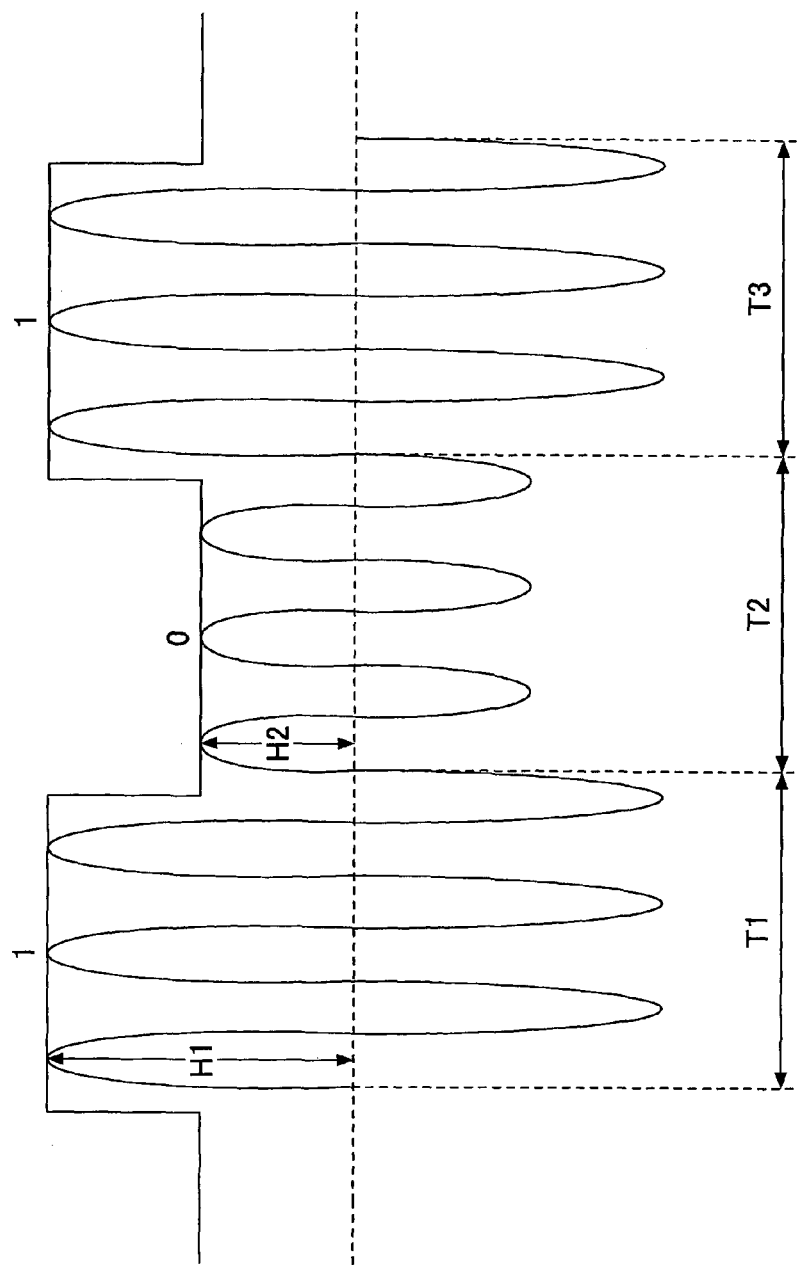
FIG. 4 illustrates a modulated carrier wave that is input to the amplifier circuit.

FIG. 4 illustrates a modulated carrier wave that is input to the amplifier circuit 100. FIG. 4 shows one example of a modulate carrier wave that is transmitted by a RFID reader. According to the first embodiment, a signal in which waveforms having an amplitude value H1 and waveforms having an amplitude value H2 occur alternately with predetermined frequency is assumed as a modulated carrier signal transmitted from the RFID reader.

In the amplifier circuit 100 according to the first embodiment, it is detected that the modulated carrier wave has been received, the superimposition wave is superimposed onto the modulated carrier wave, the modulated carrier wave is thus amplified, and the thus amplified modulated carrier wave is output to the wireless chip 11. The wireless chip 11 operates using the amplified modulated carrier wave thus received from the amplifier circuit 100 as an energy source, and returns the identification information or the like stored in the memory to the RFID reader in a manner of changing the amplitude of the amplified modulated carrier wave during a period(s) of time during which the amplified modulated carrier wave has not been modulated.

Below, the amplifier circuit 100 according to the first embodiment will be described. As mentioned above, the amplifier circuit 100 according to the first embodiment includes the superimposition wave generation part 110, the harmonic removal part 120, the driver 130, the switch part 140, the attenuator 150 and the amplitude detection part 160.

The superimposition wave generation part 110 generates the superimposition wave having the predetermined frequency to be superimposed onto the modulated carrier wave that the antenna 200 has received. The superimposition wave according to the first embodiment is, for example, in phase with the modulated carrier wave transmitted by the RFID reader, and has the same frequency as that of the modulated carrier wave. Throughout the specification, "two signals are in phase" or "one signal is in phase with another signal" means that these two signals have the same frequency and reach corresponding values simultaneously, and that the phase angle between these two signals is zero. It is noted that the phase of the superimposition wave may be one that is not precisely in phase with the modulated carrier wave.

The harmonic removal part 120 according to the first embodiment removes the harmonic(s) of the superimposition wave generated by the superimposition wave generation circuit 110.

The driver 130 according to the first embodiment amplifies the modulated carrier wave and outputs the amplified modulated carrier wave. Hereinafter, a signal thus obtained from a modulated carrier wave being amplified will be referred to as an "amplified modulated carrier wave".

The switch part 140 controls connection between the driver 130 and the terminals T3 and T4. The switch part 140 is controlled by a control signal supplied by the amplitude detection part 160, and the switch part 140 is turned on and off by the control signal.

The attenuator 150 attenuates a carrier wave that has been input via the terminals T1 and T2. The amplitude detection part 160 detects a modulated carrier wave from the carrier wave that has been input via the terminals T1 and T2, and supplies the detected modulated carrier wave to the driver 130. Further, the amplitude detection part 160 according to the first embodiment outputs the control signal that turns on the switch part 140 to the switch part 140 when having detected the modulated carrier wave. The details of the amplitude detection part 160 will be described later.

Below, operations of the antenna module 10 according to the first embodiment will be described. First, operations of the antenna module 10 according to the first embodiment in a case where the antenna module 10 has received a modulated carrier wave will be described.

When a signal has been input via the antenna 200 in the antenna module 10 according to the first embodiment, the input signal is supplied to the amplitude detection part 160 via the attenuator 150.

The amplitude detection part 160 according to the first embodiment detects whether the signal is a modulated carrier wave based on the amplitude of the signal thus supplied via the attenuator 150. Specifically, the amplitude detection part 160 according to the first embodiment includes, for example, a binarization circuit or the like such as a comparator together with a carrier wave removal filter. Then, the amplitude detection part 160 may obtain a high level (hereinafter, referred to as "H level") in a case where the amplitude value of the carrier wave supplied from the attenuator 150 is H1, and obtain a low level (hereinafter, referred to as "L level") in a case where the amplitude value of the carrier wave supplied from the attenuator 150 is H2 (see FIG. 4). Hereinafter, a binary signal that the amplitude detection part 160 thus obtains based on the detected amplitude will be referred to as a "modulated binary signal".

The amplitude detection part 160 then determines, based on the modulated binary signal for example, whether a carrier wave that is input is a modulated carrier wave. More specifically, according to the first embodiment, the amplitude detection part 160 detects a carrier wave that is input to the terminals T1 and T2 as a modulated carrier wave when the thus obtained state of the signal has been changed in such a manner that, for example, the signal having the H level is obtained for a period t1 of time, the signal having the L level is obtained for a period t2 of time, and the signal having the H level is obtained for a period t3 of time (see FIG. 4). It is noted that a specific method of detecting a modulated carrier signal in the amplitude detection part 160 is not limited to the method using the above-mentioned pattern of the amplitude value of the carrier wave. The amplitude detection part 160 according to the first embodiment may detect a carrier wave that has been input as a modulated carrier wave in a case where, for example, it has been detected that the change in the state of the carrier wave has a predetermined pattern.

The amplitude detection part 160 according to the first embodiment outputs, to the switch part 140, the control signal that turns on or off the switch part 140, when having detected a modulated carrier wave. Specifically, the amplitude detection part 160 turns on the switch part 140 using the control signal when having detected a modulated carrier wave. Further, the amplitude detection part 160 according to the first embodiment outputs the modulated carrier wave to the driver 130.

Further, according to the first embodiment, a carrier wave that has been input is supplied to the superimposition wave generation part 110 and the driver 130 via the attenuator 150. It is preferable that the superimposition wave generation part 110 carries out phase correction for causing the carrier wave and the superimposition wave to be in phase.

When the switch part 140 has been turned on by the switch signal, the driver 130 and the terminals T3 and T4 are connected.

According to the first embodiment, to the driver 130, the superimposition wave generated by the superimposition generation part 110 and the modulated carrier wave supplied by the amplitude detection part 160 are input. In the driver 130 according to the first embodiment, the superimposition wave is added to the modulated carrier wave, and thus, an amplified modulated carrier wave is obtained. The amplified modulated carrier wave is supplied to the wireless chip 11 via the terminals T3 and T4.

Next, operations of the antenna module 10 according to the first embodiment for a case of transmitting the response signal that has been output from the wireless chip 11 will be described.

The antenna module 10 according to the first embodiment does not amplify the response signal when transmitting the response signal that has been output from the wireless chip 11 to the RFID reader. The signal that is output from the wireless chip 11 is a signal in which the amplitude value of the amplified modulated carrier wave has been changed through load modulation.

In the antenna module 10 according to the first embodiment, the terminals T1 and T2 are connected also with the wireless chip 11 via the impedance adjustment circuit 12. Therefore, there is a case where the response signal that has been output from the wireless chip 11 is input to the antenna module 10. In this case, the amplitude value of the carrier wave that is thus input via the terminals T1 and T2 to the amplifier circuit 10 does not have the predetermined pattern. As a result, the amplitude detection part 160 does not output the control signal that turns on the switch part 140 to the switch part 140, and thus, the switch part 140 is kept turned off. Thus, the driver 130 is not connected with the terminals T3 and T4, and no signal is output from the antenna module 10 via the terminals T3 and T4.

As a result, only the signal that has been output from the wireless chip 11 is supplied to the antenna 200, and is transmitted from the antenna 200.

Thus, according to the first embodiment, it is possible to supply to the wireless chip 11 an amplified modulated carrier wave that is obtained from the superimposition wave being added to the modulated carrier wave, only in a case where a carrier wave that the antenna 200 has received is a modulated carrier wave that carries a communication signal. Therefore, according to the first embodiment, it is possible to miniaturize the antenna 200 while maintaining the communication performance.

It is noted that, according to the first embodiment, the amplitude detection part 160 turns on the switch part 140 and connects the driver 130 with the terminals T3 and T4 only when having detected a modulated carrier wave. However, an embodiment is not limited thereto.

Instead, the amplitude detection part 160 may turn on the switch part 140 and connect the driver 130 with the terminals T3 and T4 only when the amplitude value of the carrier wave is H1. In this case, the switch part 140 is turned on and the amplified modulated carrier wave obtained from the superimposition wave being added to the modulated carrier wave is output during the periods T1 and T3 of time shown in FIG. 4. Therefore, the amplified modulated carrier wave that is output from the driver 130 has the amplitude value that is amplified only during the periods T1 and T3 of time, and thus, it is possible to increase the amplitude change.

Further, although the antenna module 10 includes the amplifier circuit 100 and the antenna 200 according to the first embodiment, the antenna module 10 may also include the wireless chip 11. Further, although the wireless chip 11 and the amplifier circuit 100 are connected in parallel with the antenna 200, an embodiment is not limited to this configuration. For example, the wireless chip 11 may be connected subsequent to the amplifier circuit 100.

Second Embodiment

Below, a second embodiment will be described. The second embodiment is different from the first embodiment only in that, to a modulated carrier wave detected by the amplitude detection part 160, a superimposition wave having the opposite phase is added, whereby the amplitude change in the amplified modulated carrier wave is increased. In the description of the second embodiment, the same reference numerals as those used in the description of the first embodiment are given to parts/components same as or similar to those in the first embodiment, and duplicate description therefor will be omitted.

Figure 5:
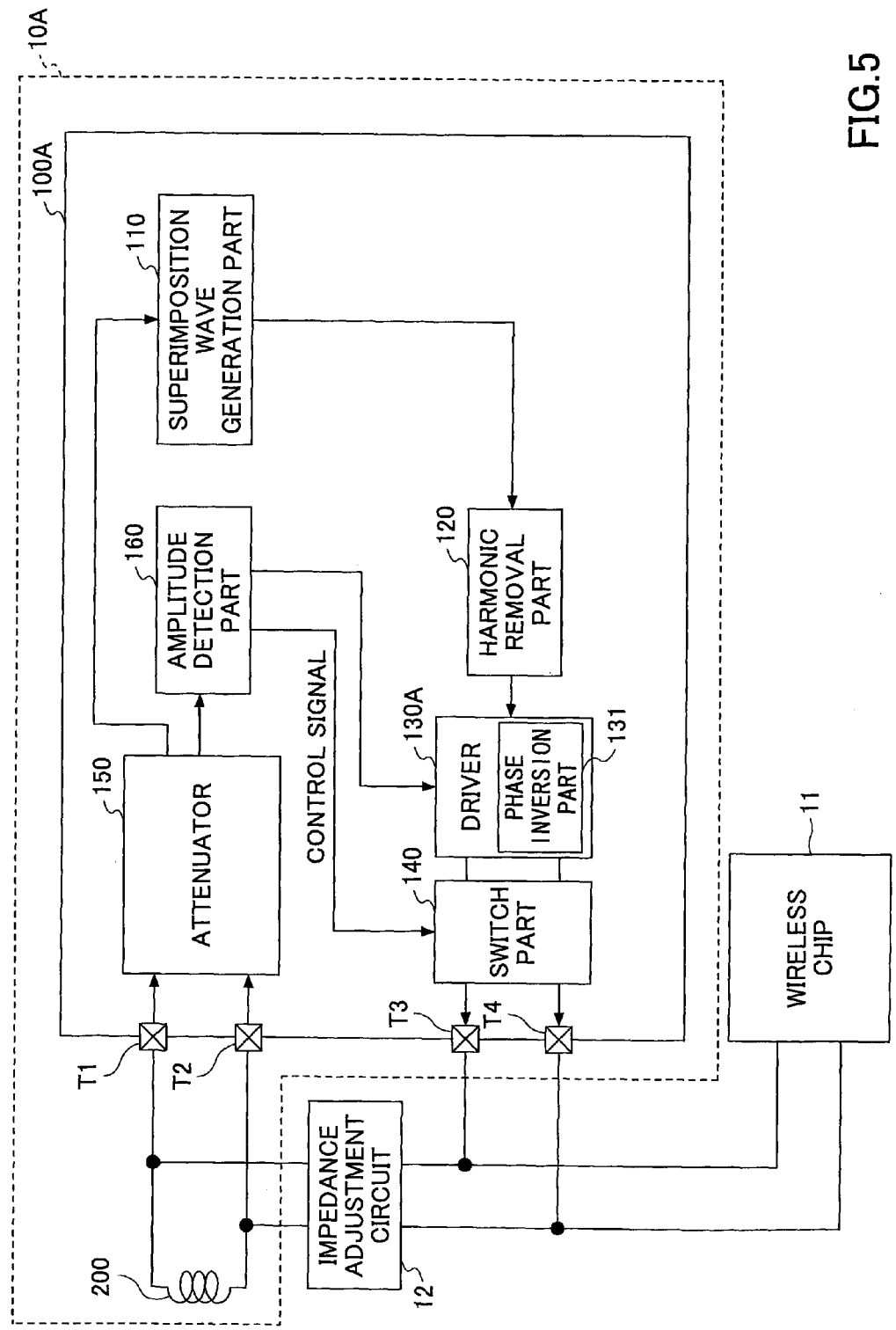
FIG. 5 illustrates an amplifier circuit according to a second embodiment.

FIG. 5 illustrates an amplifier circuit 100A according to the second embodiment. In an antenna module 10A according to the second embodiment, the amplifier circuit 100A has a driver 130A. The driver 130A according to the second embodiment has a phase inversion part 131, and thereby, the phase of the superimposition wave that is output from the harmonic removal part 120 is then inverted.

Further, the amplitude detection part 160 according to the second embodiment turns on the switch part 140 and connects the driver 130A with the terminals T3 and T4 only during the period T2 of time shown in FIG. 4. As a result of the switch part 140 being controlled in this manner, the superimposition wave in which the phase is thus inverted is added to the modulated carrier wave during the period of time during which the amplitude value is H2 in the modulated carrier wave. Therefore, according to the second embodiment, the amplitude value H2 of the modulated carrier wave during the period T2 of time is canceled out by the superimposition wave having the opposite phase, and thus, is reduced. Therefore, the amplified modulated carrier signal that is output from the driver 130A is such that the amplitude change is thus increased.

It is to be noted that, although the phase of the superimposition wave is inverted by the phase inversion part 131 according to the second embodiment, an embodiment is not limited thereto. For example, the harmonic removal part 120 and the driver 130 (not including the phase inversion part 131) may be connected in such a manner that the phase of the superimposition wave that is output from the harmonic removal part 120 is inverted and the superimposition wave is input to the driver 130.

Thus, according to the second embodiment, it is possible to increase the change in the amplitude value of the amplified modulated carrier wave. Therefore, according to the second embodiment, it is possible to maintain the communication performance even when the antenna 200 is miniaturized and thus the gain is deteriorated.

Third Embodiment

Below, using the drawings, a third embodiment of the present invention will be described. The third embodiment is different from the above-described first embodiment in that, according to the third embodiment, control is carried out to cause a superimposition wave and a carrier wave to be in phase. In the description of the third embodiment, the same reference numerals as those used in the description of the first embodiment are given to parts/components same as or similar to those in the first embodiment, and duplicate description therefor will be omitted.

According to the third embodiment, a superimposition wave that is in phase with a carrier wave that is received via the antenna 200 is generated.

Figure 6:
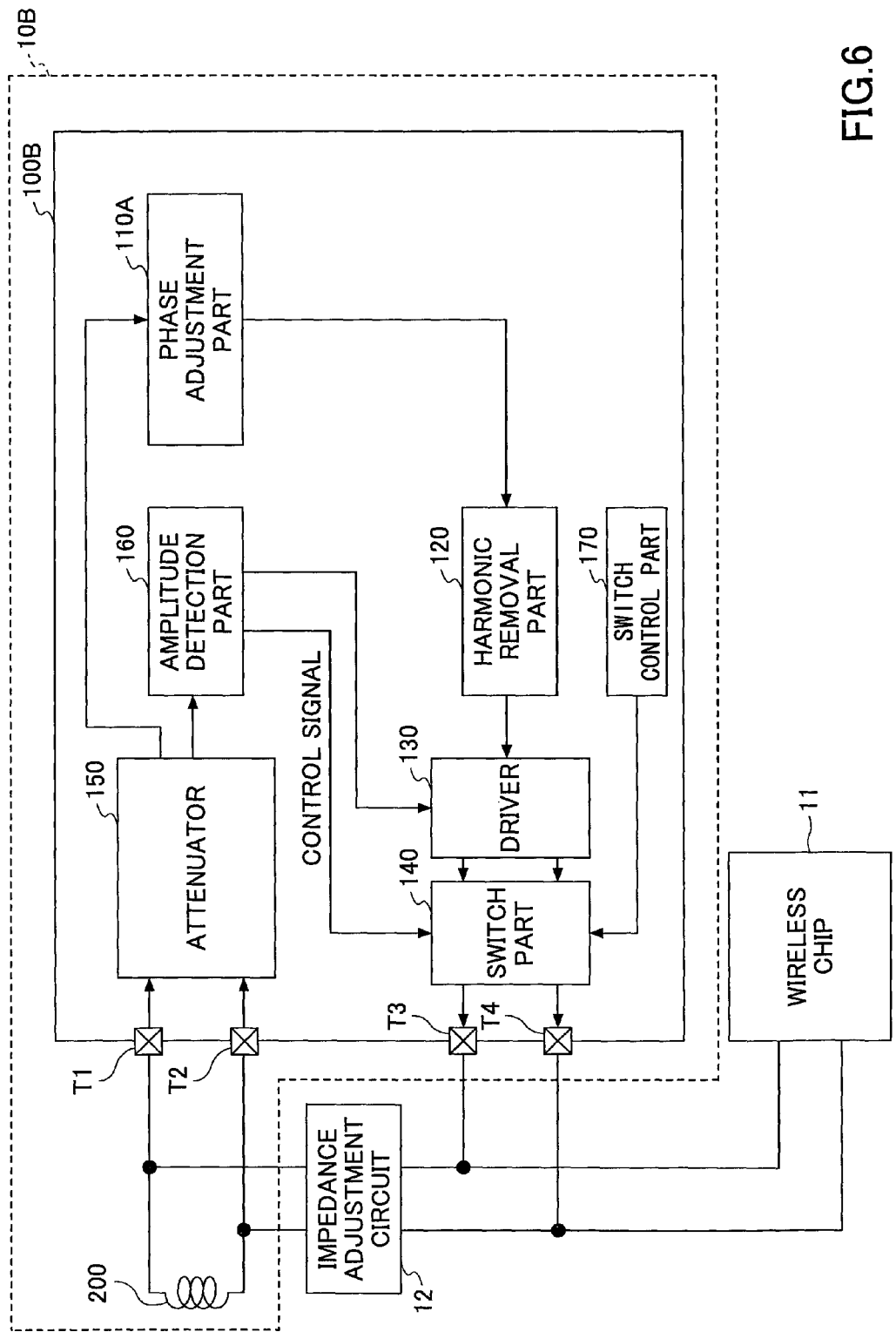
FIG. 6 illustrates an amplifier circuit according to a third embodiment.

FIG. 6 illustrates an amplifier circuit according to the third embodiment. In an antenna module 10B according to the third embodiment, the amplifier circuit 100B has a phase adjustment part 110A and a switch control part 170.

The phase adjustment part 110A according to the third embodiment generates, based on a carrier wave supplied by the attenuator 150, a superimposition wave that is in phase with the carrier wave. The phase adjustment part 110A according to the third embodiment includes, for example, a Phase-Locked Loop (PLL) circuit, or the like. The switch control part 170 according to the third embodiment turns off the switch part 140 every predetermined period of time.

Below, the reason for causing a superimposition wave and a carrier wave to be in phase will be described. In the amplifier circuit 100B according to the third embodiment, the terminals T1 and T2 as the input terminals and the terminals T3 and T4 as the output terminals are connected via the impedance adjustment circuit 12. Therefore, on a carrier wave that is input to the amplifier circuit 100B via the terminals T1 and T2, an output signal of the amplifier circuit 100B that is output via the terminals T3 and T4 is superimposed.

Therefore, in the amplifier circuit 100B according to the third embodiment, in a case where the carrier wave is a modulated carrier wave, the signal to be amplified by the amplifier circuit 100B is the signal obtained from superimposition of the modulated carrier wave and the output signal, and the superimposition wave is added to the signal in the amplifier circuit 100B.

At this time, in a case where, for example, the superimposition wave is not in phase with the carrier wave, the modulated carrier wave is not properly amplified, and thus, there is likelihood that the wireless chip 11 cannot identify the modulated carrier wave. In a case where, for example, the wireless chip 11 demodulates (binarizes) the modulated carrier wave and reads information therefrom, or so, there is likelihood that the wireless chip 11 cannot properly demodulate the modulated carrier wave, and thus, a problem occurs in the communication.

Therefore, according to the third embodiment, control is carried out for causing the superimposition wave to be superimposed on the signal in the amplifier circuit 100B and the carrier wave (i.e., the modulated carrier wave) to be in phase.

Below, control of phase in the amplifier circuit 100B according to the third embodiment will be described.

According to the third embodiment, off periods of time are provided in which the switch part 140 is periodically turned off, and the superimposition wave is generated which is caused to be in phase with the carrier wave that has been input via the terminals T1 and T2 during the off periods of time.

Figure 7:
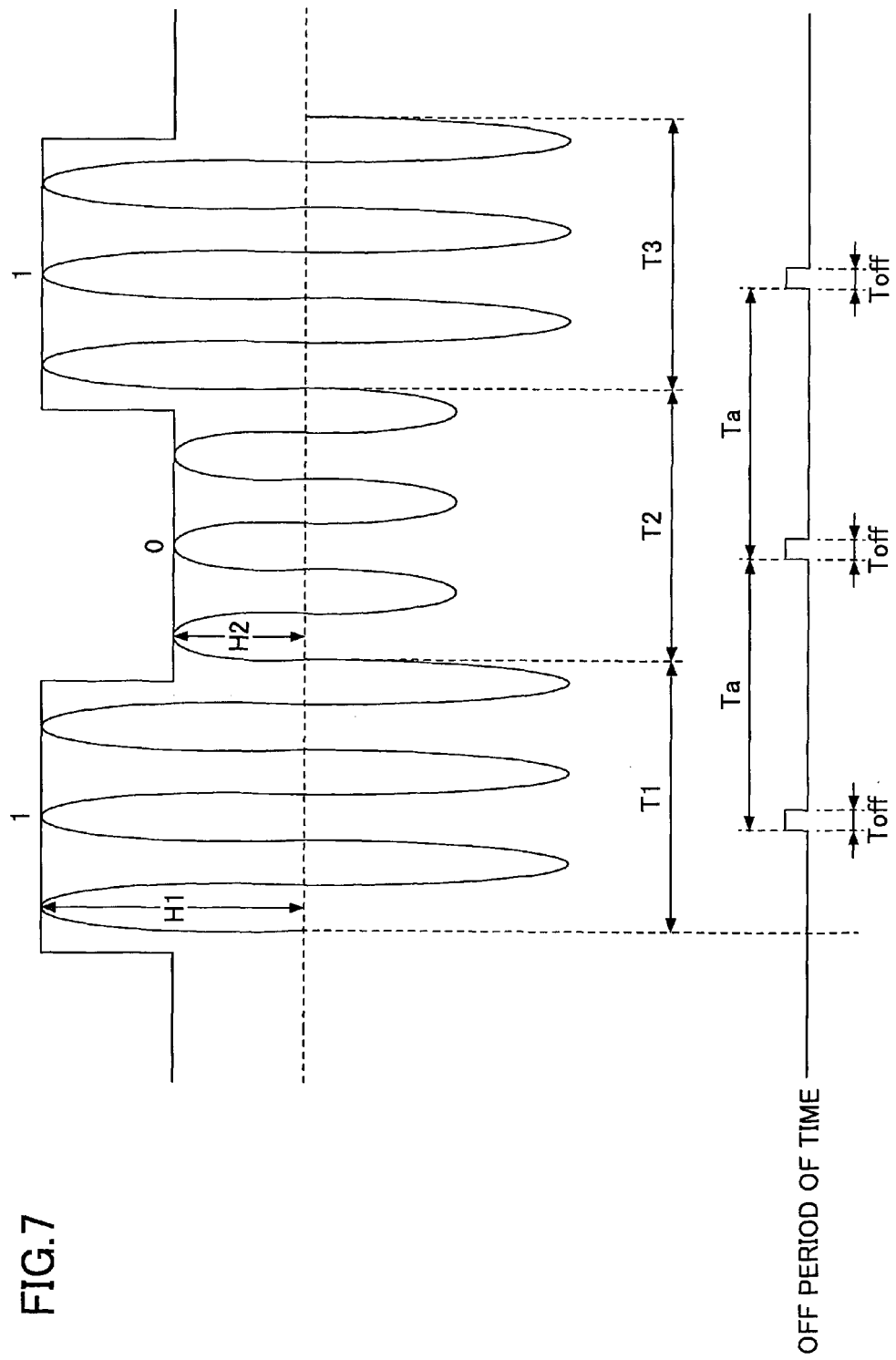
FIG. 7 illustrates off periods of time in the third embodiment.

FIG. 7 illustrates the off periods of time according to the third embodiment. The example of FIG. 7 shows a case where the carrier wave is a modulated carrier wave.

The switch control part 170 according to the third embodiment turns off the switch part 140 during the off period Toff of time every predetermined period Ta of time, for example. Therefore, in the amplifier circuit 100B according to the third embodiment, during the off periods Toff of time, the driver 130 and the terminals T3 and T4 are not connected.

It is to be noted that in a case where the carrier wave is a modulated carrier wave, an amplified modulated carrier wave that is output from the driver 130 is to be supplied to the wireless chip 11. However, it is necessary to supply an amplified modulated carrier wave to the wireless chip 11 in such a manner that the wireless chip 11 can carry out demodulation.

Therefore, according to the third embodiment, the off periods Toff of time are determined to be sufficiently short in comparison to the respective periods T1, T2 and T3 of time during each of which the amplitude of the modulated carrier wave is constant. By thus setting the off periods Toff of time, it is possible to provide the off periods Toff of time of the switch part 140 without hindering demodulation that is carried out in the wireless chip 11.

The phase adjustment circuit 110A according to the third embodiment generates the superimposition wave that is in phase with the carrier wave, using, as an input frequency, the frequency of the modulated carrier wave (i.e., the frequency of the carrier wave) that is supplied via the amplitude detection part 160 during the off periods Toff of time.

According to the third embodiment, it is possible to output the amplified modulated carrier wave, obtained as a result of the amplitude value of the modulated carrier wave being amplified, to the wireless chip 11, by generating the superimposition wave that is in phase with the carrier wave.

It is to be noted that, although not shown, for example, another switch part may be provided for controlling connection between the attenuator 150 and the phase adjustment circuit 110A so that the modulated carrier wave is supplied to the phase adjustment circuit 110A only during the off periods Toff of time.

Further, although the case where the modulated carrier wave is input to the amplifier circuit 100B has been described in the example of FIG. 7, an embodiment is not limited thereto. Such control of phase using the switch control part 170 and the phase adjustment circuit 110A according to the third embodiment may be carried out every predetermined period Ta of time even during a period of time during which a carrier wave that carries no communication signal is input to the amplifier circuit 100B.

Thus, according to the third embodiment, the amplitude component of the modulated carrier wave is amplified by the superimposition wave which is in phase with the carrier wave. Therefore, it is possible to miniaturize the antenna while maintaining the communication performance.

Fourth Embodiment

Below, a fourth embodiment of the present invention will be described using the drawings. The fourth embodiment is different from the above-described first embodiment in that, also a response signal returned from a wireless chip is amplified. Below, in the description of the fourth embodiment, only the points different from the first embodiment will be described, the same reference numerals as those used in the description of the first embodiment are given to parts/components same as or similar to those in the first embodiment, and duplicate description therefor will be omitted.

Figure 8:
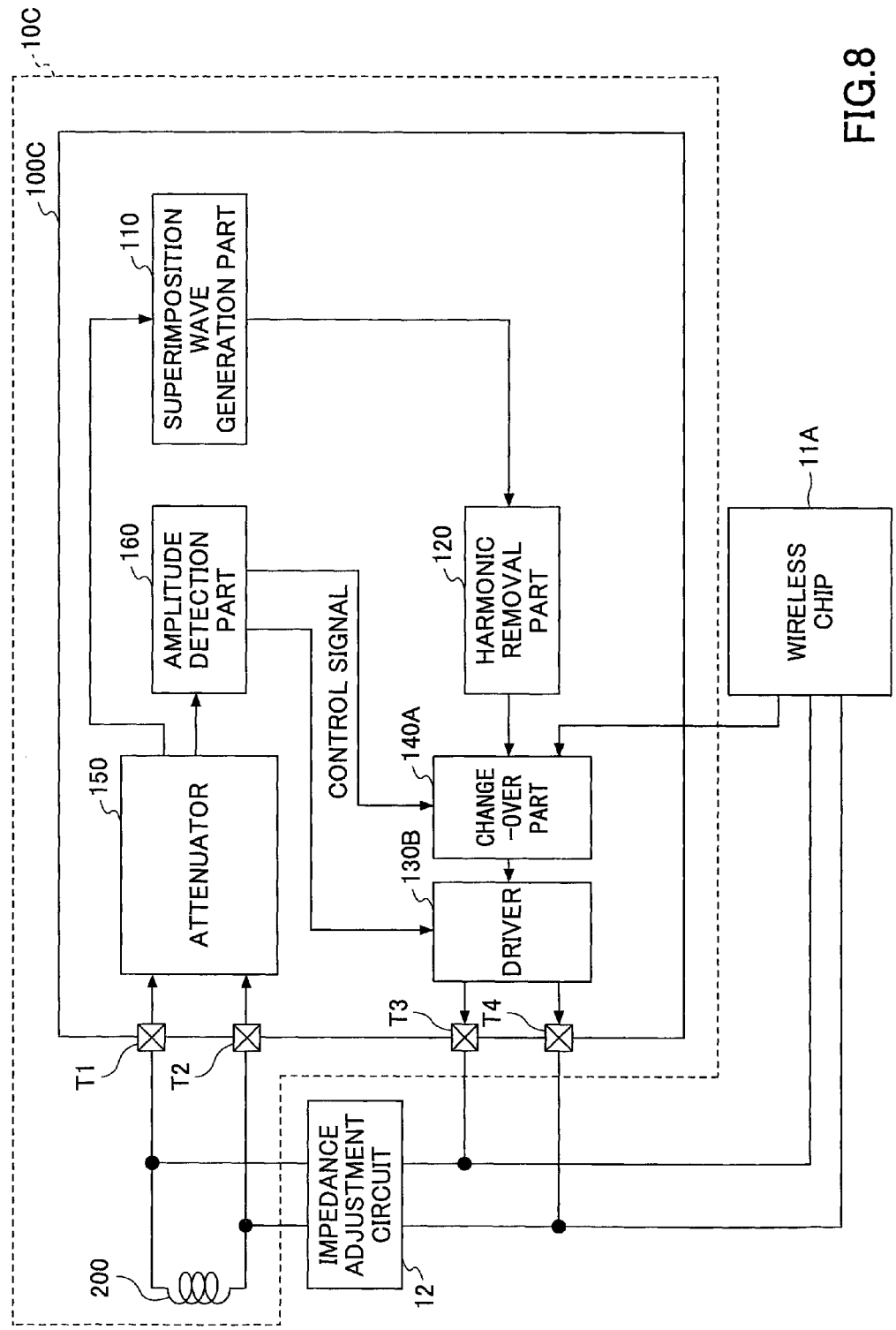
FIG. 8 illustrates an amplifier circuit according to a fourth embodiment.

FIG. 8 illustrates an amplifier circuit according to the fourth embodiment.

An antenna module 100 according to the fourth embodiment has the amplifier circuit 100C. The amplifier circuit 100C according to the fourth embodiment has a changeover part 140A. Further, in the fourth embodiment, when a wireless chip 11A returns identification information and/or the like to a RFID reader in a such a manner that the reflected wave of an amplified modulated carrier wave carries it, the wireless chip 11A returns it via the amplifier circuit 100C. Hereinafter, such a signal in which identification information and/or the like is carried by the reflected wave of an amplified modulated carrier wave will be referred to as a "response signal".

The changeover part 140A according to the fourth embodiment is connected between the harmonic removal part 120 and a driver 130B. The output of the harmonic removal part 120 and the output of the wireless chip 11A are input to the changeover part 140A, and the output of the changeover part 140A is supplied to the driver 130B. The changeover part 140A according to the fourth embodiment acts as a selector for connecting either the harmonic removal part 120 or the wireless chip 11A to the driver 130B based on a control signal provided by the amplitude detection part 160. The output of the driver 130B is directly connected to the terminals T3 and T4.

Below, operations of the amplifier circuit 100C according to the fourth embodiment will be described.

In the amplifier circuit 100C according to the fourth embodiment, the amplitude detection part 160 outputs such a control signal to the changeover part 140A as to cause the changeover part 140A to connect the harmonic removal part 120 with the driver 130B when having detected reception of a modulated carrier wave.

When the harmonic removal part 120 and the driver 130B are thus connected, the driver 130B outputs an amplified modulated carrier wave obtained from adding a modulated carrier wave and a superimposition wave, and the output amplified modulated carrier signal is supplied to the wireless chip 11A.

On the other hand, when having detected a response output (response signal) from the wireless chip 11A, the changeover part 140A supplies the output of the wireless chip 11A to the driver 130B.

When the output of the wireless chip 11A has been thus supplied to the driver 130B, the response signal that has been output by the wireless chip 11A is amplified by the driver 130B. Thus, according to the fourth embodiment, the driver 130B has the function of amplifying the response signal, in addition to the function of amplifying the modulated carrier wave by adding thereto (superimposing thereon) the superimposition wave as in the driver 130 according to the first embodiment. Therefore, the antenna module 100 according to the fourth embodiment can transmit a response signal that has a sufficient intensity via the antenna 200, and thus, it is possible to miniaturize the antenna 200 while maintaining the communication performance.

Fifth Embodiment

Below, a fifth embodiment of the present invention will be described using the drawings. According to the fifth embodiment, a signal that is output from an amplifier circuit to a wireless chip and a signal that is input to the amplifier circuit from the wireless chip are binarized signals, respectively. Below, in the description of the fifth embodiment, only the points different from the first embodiment will be described, the same reference numerals as those used in the description of the first embodiment are given to parts/components same as or similar to those in the first embodiment, and duplicate description therefor will be omitted.

Figure 9:
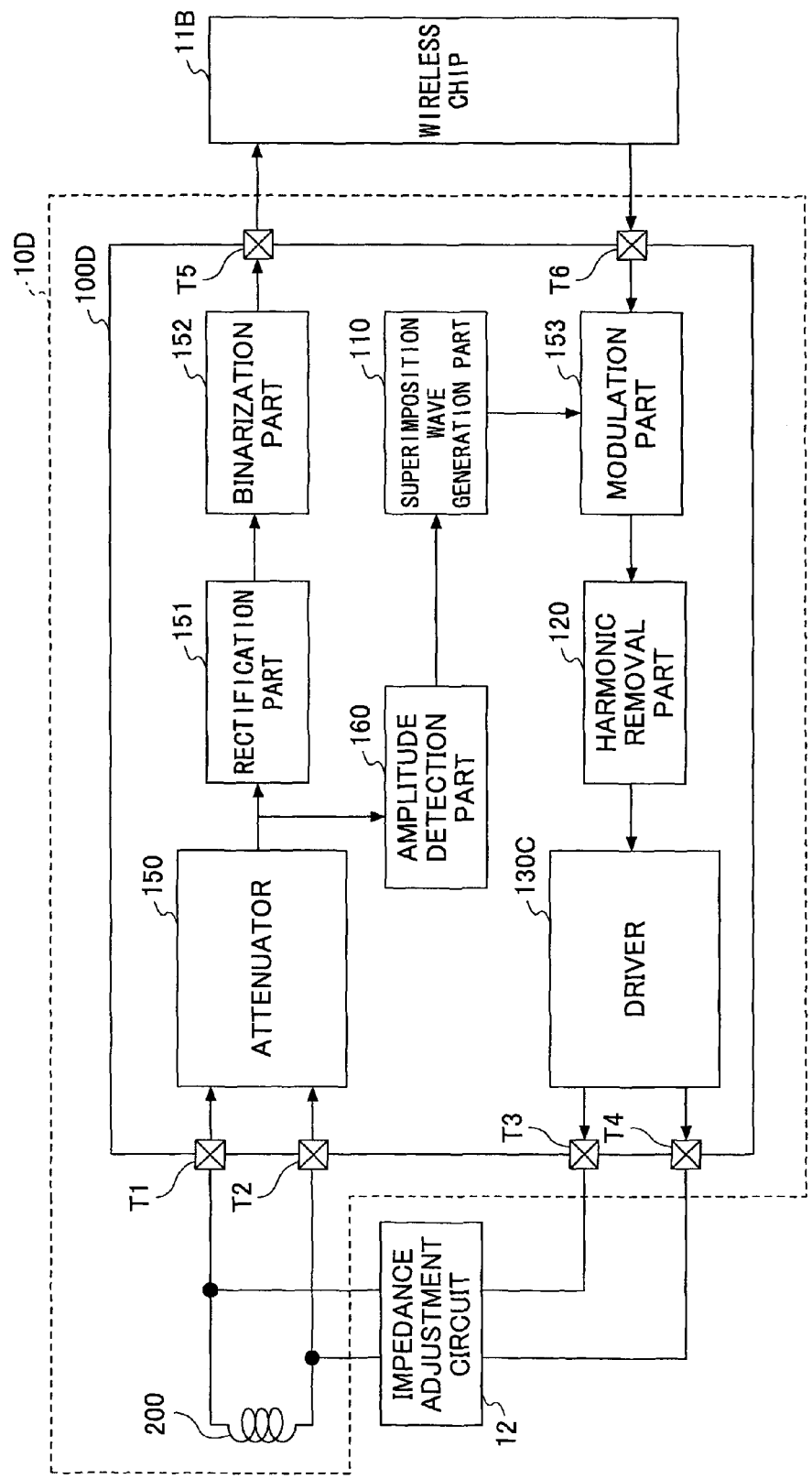
FIG. 9 illustrates an amplifier circuit according to a fifth embodiment.

FIG. 9 illustrates the amplifier circuit according to the fifth embodiment. An antenna module 10D according to the fifth embodiment has the amplifier circuit 100D. The amplifier circuit 100D has terminals T5 and T6, and is connected with the wireless chip 11B via the terminals T5 and T6.

Further, the amplifier circuit 100D according to the fifth embodiment has a rectification part 151, a binarization part 152 and a modulation part 153. The output of the attenuator 150 is supplied to the rectification part 151 according to the fifth embodiment, and the rectification part 151 rectifies the supplied signal. The output of the rectification part 151 is supplied to the binarization part 152, and the binarization part 152 generates the binarized signal based on the supplied signal. The binarized signal is output to the wireless chip 11B via the terminal T5.

According to the fifth embodiment, a modulated carrier wave detected by the amplitude detection part 160 is used by the superimposition wave generation part 110 to generate a superimposition wave. The superimposition wave generation part 110 according to the fifth embodiment generates the superimposition wave that is in phase with the modulated carrier wave based on a modulated carrier wave.

The signal at the terminal T6 and the superimposition wave generated by the superimposition wave generation part 110 are input to the modulation part 153. The modulation part 153 modulates the binary response signal that has been output from the wireless chip 11B based on the superimposition wave and outputs an analog signal.

The output of the modulation part 153 is supplied to the harmonic removal part 120. The output of the harmonic removal part 120 is supplied to a driver 130C, is thus amplified, and is transmitted via the antenna 200. Therefore, the driver 130C according to the fifth embodiment is used to amplify the response signal that has been output from the wireless chip 11B. Thus, according to the fifth embodiment, the driver 130C has the function of amplifying the response signal, instead of the function of amplifying the modulated carrier wave by adding thereto (superimposing thereon) the superimposition wave as in the driver 130 according to the first embodiment.

According to the fifth embodiment, by binarizing the modulated carrier wave in the amplifier circuit 100D, it is possible that the wireless chip 11B can precisely recognize the received modulated carrier wave. Therefore, according to the fifth embodiment, it is possible to miniaturize the antenna 200 while maintaining the communication performance.

Thus, according to the amplifier circuits, the antenna modules and the wireless communication apparatuses in the embodiments, it is possible to miniaturize the antennas while maintaining the communication performance.

Although the amplifier circuits, the antenna modules and the wireless communication apparatuses have been described by the embodiments, the present invention is not limited to the specifically disclosed embodiments, and variations and modifications may be made without departing from the scope of the present invention.

The present application is based on and claims the benefit of priority of Japanese Priority Application No. 2012-201399 filed on Sep. 13, 2012, and Japanese Priority Application No. 2013-009536 filed on Jan. 22, 2013, the entire contents of which are hereby incorporated herein by reference.

The invention claimed is:

1. An amplifier circuit that amplifies a carrier wave that a transmitting and receiving part has received, the amplifier circuit comprising:
    a superimposition wave generation part that generates a superimposition wave to be superimposed onto the carrier wave;
    an amplifying part that adds the carrier wave and the superimposition wave to obtain an amplified carrier wave, and outputs the amplified carrier wave;
    an amplitude detection part that detects, based on a change in an amplitude value of the carrier wave, that the carrier wave is a predetermined carrier wave that carries a predetermined communication signal, wherein the amplifier circuit outputs the amplified carrier wave when the amplitude detection part has detected the predetermined carrier wave; and
    a switch part that controls connection between the amplifying part and an output terminal of the amplifier circuit, wherein
    the amplitude detection part controls the switch part to supply the output of the amplifying part to the output terminal of the amplifier circuit when the amplitude detection part has detected the predetermined carrier wave.

2. The amplifier circuit as claimed in claim 1, wherein
    the superimposition wave generation part generates the superimposition wave that is in phase with the carrier wave and has a predetermined frequency.

3. The amplifier circuit as claimed in claim 2, further comprising
    a switch part that controls connection between the amplifying part and an output terminal of the amplifier circuit, wherein
    the amplitude detection part controls the switch part to supply the output of the amplifying part to the output terminal of the amplifier circuit when having detected the predetermined carrier wave.

4. The amplifier circuit as claimed in claim 3, further comprising
    a switch control part that controls the switch part so as to provide an off period of time for not supplying the output of the amplifying part to the output terminal of the amplifier circuit, wherein
    the superimposition wave generation part generates the superimposition wave that is in phase with the carrier that has been received during the off period of time of the switch part.

5. The amplifier circuit as claimed in claim 3, further comprising
    a changeover part that switches between connection of a wireless communication part that transmits a response signal using the transmitting and receiving part via the amplifier circuit with the amplifying part and connection of a harmonic removal part that removes a harmonic component from the superimposition wave with the amplifying part, wherein
    the changeover part
        supplies an output of the harmonic removal part to the amplifying part when the amplitude detection part has detected the predetermined carrier wave, and
        supplies an output of the wireless communication part to the amplifying part when having detected the output of the wireless communication part.

6. The amplifier circuit as claimed in claim 1, further comprising
    a switch control part that controls the switch part so as to provide an off period of time for not supplying the output of the amplifying part to the output terminal of the amplifier circuit, wherein
    the superimposition wave generation part generates the superimposition wave that is in phase with the carrier that has been received during the off period of time of the switch part.

7. An antenna module comprising:
    a transmitting and receiving part that wirelessly transmits and receives signals; and
    the amplifier circuit according to claim 1, to amplify a carrier wave that the transmitting and receiving part has received.

8. A wireless communication apparatus comprising:
    a transmitting and receiving part that wirelessly transmits and receives signals;
    the amplifier circuit according to claim 1, to amplify a carrier wave that the transmitting and receiving part has received; and
    a wireless communication part that carries out communication using the signals.

9. An amplifier circuit that amplifies a carrier wave that a transmitting and receiving part has received, the amplifier circuit comprising:

a superimposition wave generation part that generates a superimposition wave to be superimposed onto the carrier wave;

an amplifying part that adds the carrier wave and the superimposition wave to obtain an amplified carrier wave, and outputs the amplified carrier wave;

an amplitude detection part that detects, based on a change in an amplitude value of the carrier wave, that the carrier wave is a predetermined carrier wave that carries a predetermined communication signal, wherein the amplifier circuit outputs the amplified carrier wave when the amplitude detection part has detected the predetermined carrier wave; and a changeover part that switches between connection of a wireless communication part that transmits a response signal using the transmitting and receiving part via the amplifier circuit with the amplifying part and connection of a harmonic removal part that removes a harmonic component from the superimposition wave with the amplifying part, wherein the changeover part
supplies an output of the harmonic removal part to the amplifying part when the amplitude detection part has detected the predetermined carrier wave, and
supplies an output of the wireless communication part to the amplifying part when having detected the output of the wireless communication part.

10. An antenna module comprising:
a transmitting and receiving part that wirelessly transmits and receives signals; and
the amplifier circuit according to claim 5, to amplify a carrier wave that the transmitting and receiving part has received.

11. A wireless communication apparatus comprising:
a transmitting and receiving part that wirelessly transmits and receives signals;
the amplifier circuit according to claim 9, to amplify a carrier wave that the transmitting and receiving part has received; and
a wireless communication part that carries out communication using the signals.

* * * * *